(12) United States Patent
Flanagan et al.

(10) Patent No.: US 7,430,698 B2
(45) Date of Patent: Sep. 30, 2008

(54) METHOD AND SYSTEM FOR AN ON-CHIP AC SELF-TEST CONTROLLER

(75) Inventors: John D. Flanagan, Rhinebeck, NY (US); Jay R. Herring, Poughkeepsie, NY (US); Tin-Chee Lo, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 272 days.

(21) Appl. No.: 11/323,449

(22) Filed: Dec. 30, 2005

(65) Prior Publication Data

US 2006/0242509 A1   Oct. 26, 2006

Related U.S. Application Data

(63) Continuation of application No. 10/131,554, filed on Apr. 24, 2002, now Pat. No. 7,058,866.

(51) Int. Cl.
*G01R 31/28* (2006.01)
(52) U.S. Cl. .................................... 714/726
(58) Field of Classification Search .................. 714/726
See application file for complete search history.

(56) References Cited

U.S. PATENT DOCUMENTS

| 4,916,388 | A  | 4/1990 | Sano ...................... 324/158 R |
| 5,329,532 | A  | 7/1994 | Ikeda et al. ................. 371/22.3 |
| 5,444,715 | A  | 8/1995 | Gruetzner et al. .......... 371/22.3 |
| 6,021,514 | A  | 2/2000 | Koprowski ................... 714/733 |
| 6,178,534 | B1 | 1/2001 | Day et al. .................... 714/745 |
| 6,219,811 | B1 | 4/2001 | Gruetzner et al. ........... 714/726 |
| 6,510,534 | B1 | 1/2003 | Nadeau-Dostie et al. .... 714/724 |
| 6,629,276 | B1 | 9/2003 | Hoffman et al. ............ 714/726 |

OTHER PUBLICATIONS

Research Disclosure (409143); Title: "Built-In Self Test Circuit with PLL (Phase-Locked Loop) Circuit"; p. 653; May 1998.

(Continued)

*Primary Examiner*—James C Kerveros
(74) *Attorney, Agent, or Firm*—Cantor Colburn LLP; Lily Neff (57) ABSTRACT

A method and system for performing AC self-test on an integrated circuit that includes a system clock for use during normal operation are provided. The method includes applying a long data capture pulse to a first test register in response to the system clock, applying an at speed data launch pulse to the first test register in response to the system clock, inputting the data from the first register to a logic path in response to applying the at speed data launch pulse to the first test register, applying an at speed data capture pulse to a second test register in response to the system clock, inputting the logic path output to the second test register in response to applying the at speed data capture pulse to the second test register, and applying a long data launch pulse to the second test register in response to the system clock.

10 Claims, 5 Drawing Sheets

OTHER PUBLICATIONS

Research Disclosure (410108); Title: "SRAM Cycle Time Test Procedure"; p. 790; Jun. 1998; Disclosed by: International Business Machines Corporation.

Research Disclosure, Dec. 1992, No. 344; Title: "AC Self-Test Across Asynchronous Logic Partitions"; AT887-0811 TET; Authors: J.R. Dillinger, J.R. Ripley and J.S. Thornley; Published by Kenneth Mason Publications Ltd, England.

Research Disclosure 430181, Feb. 2000, p. 394; Title: "Scanning using on-product clock generation"; Disclosed by International Business Machines Corporation.

IBM Technical Disclosure Bulletin, vol. 33, No. 1B, Jun. 1990; AT887-1042 TET; Authors: H.B. Bakoglu, T.K. Jaber, I. M. Ratiu, K. Shah and W. G. Tuten; Title: "Built-In Self-Test of Arrays Embedded in Logic Chips"; pp. 306-309.

IBM Technical Disclosure Bulletin, vol. 35, No. 1B, Jun. 1992; AT891-0639 CKS; Author: T. Jaber; Title: "AC Array Self-Test"; pp. 73-76.

METHOD AND SYSTEM FOR AN ON-CHIP AC SELF-TEST CONTROLLER

CROSS REFERENCE TO RELATED APPLICATIONS

This application is a continuation of U.S. patent application Ser. No. 10/131,554 filed Apr. 24, 2002, now U.S. Pat. No. 7,058,866, the contents of which are incorporated by reference herein in their entirety.

GOVERNMENT RIGHTS

This invention was made with Government support under subcontract B338307 under prime contract W-7405-ENG-48 awarded by the Department of Energy. The Government has certain rights in this invention.

FIELD OF THE INVENTION

The present invention relates generally to a method of performing an AC self-test on an integrated circuit, and more particularly to performing the AC self-test using the same system clock that is utilized during normal system operation.

BACKGROUND OF THE INVENTION

As the design of integrated circuits has progressed, more and more circuitry is being disposed in increasingly dense patterns and it has become correspondingly more difficult to test and diagnose such circuits. Several methodologies for performing integrated circuit testing use level sensitive scan design (LSSD) techniques to facilitate circuit testing and diagnosis. Integrated circuit devices of interest typically contain blocks of combinatorial logic paths whose inputs and outputs are supplied to certain memory elements. In an LSSD system, the memory elements are configurable to become shift register latches (SRLs). During test mode, these SRLs are capable of storing predetermined data patterns through a shifting operation. A plurality of SRLs can comprise a scan path with the output signals from the latch strings supplied to a signature register or multiple input signature register (MISR) for comparison and analysis with known results. During operation of the circuit in the normal system environment, the SRLs function as memory elements passing signals to be processed from one combinatorial block to another and at the same time typically receiving input signals for subsequent application to combinatorial logic blocks in subsequent clock cycles. The SRLs play a significant role in establishing and defining stable logic outputs at appropriate points in a machine cycle. Thus, the SRLs serve a dual purpose, one during test and one during normal system operation. Typically, one or more test clocks are supplied to the SRLs during system test. The operation of these clocks must be coordinated and tuned to exhibit the proper waveforms during system test in order to ensure accurate test results.

The scan operations and SRLs described above can be used to measure timing characteristics on an integrated circuit. Screening out integrated circuits with timing problems becomes essential as the number of integrated circuits that can pass low frequency tests but fail high frequency tests increases.

SUMMARY

An exemplary embodiment of the present invention is a method for performing AC self-test on an integrated circuit that includes a system clock for use during normal operation. The method comprises applying a long data capture pulse to a first test register in response to the system clock. An at speed data launch pulse is applied to the first test register in response to said system clock. The data from the first register is input to a logic path in response to applying the at speed data launch pulse to the first test register. An at speed data capture pulse is applied to a second test register in response to the system clock. The output from the logic path is input to the second test register in response to applying the at speed data capture pulse to the second test register. A long data launch pulse is applied to the second test register in response to the system clock. An additional embodiment includes a system for performing AC self-test on an integrated circuit that includes a system clock.

BRIEF DESCRIPTION OF THE DRAWINGS

Referring now to the figures, which are exemplary embodiments, and wherein the like elements are numbered alike.

DETAILED DESCRIPTION OF THE INVENTION

The present invention discloses a method to perform an AC self-test using a scheme that renders distribution and tuning of control signals to the clock splitters noncritical. In an exemplary embodiment, the AC self-test is performed by first initializing all the shift register latches (SRLs) with test data using a process that is known in the art. The initializing can be performed by scanning all the SRLs within the integrated circuit with a set of pseudo random data by pulsing the scan clocks as many times as needed to fill the SRLs with data. The A clock is typically the scan clock the causes the test data at the L1 input port to enter the L1 latch and the B clock is typically the scan clock that causes the data from the L1 latch to enter the L2 latch and the input port of the next L1 latch in the chain. The A clock should pulse last so that L1 and L2 contain different data at the end of the scan or initialization operation.

Figure 1:
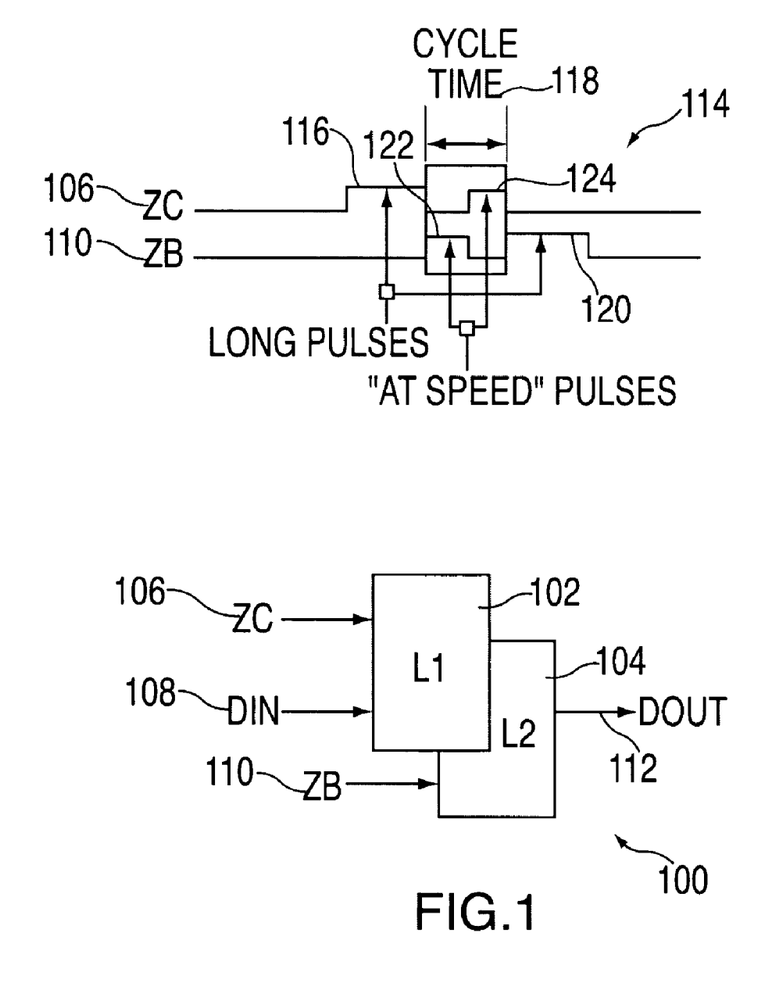
FIG. 1 is a diagram of a clock pulse and a shift register latch (SRL) used in an exemplary embodiment of the present invention.

Once the SRLs are initialized, the AC self-test of the present invention is performed at operating frequency to check if the stored data can be transferred through the critical path successfully. FIG. 1 depicts an AC self-test clocking sequence 114 that can be used to implement the present invention and be applied after scanning has been completed. The exemplary embodiment in FIG. 1 depicts a single step operation but the invention can be expanded to include operations of multiple steps. The sequence is: a long ZC clock pulse 116, an at speed ZB clock pulse 122, an at speed ZC clock pulse 124, and finally a long ZB clock pulse 120. The middle two at speed pulses 122 124, performing a single step operation, test the logic at operating speed. The length of time that it takes for the two at speed pulses 122 124 to execute is also referred to as the cycle time 118. The cycle time 118 is the time period during which the AC at speed self-test is performed. The long ZC clock pulse 116 at the beginning is to allow plenty of time to condition the L1 portion of the SRL 102 with stable data prior to the AC self-test. Similarly, the long ZB clock pulse 120 at the end is to ensure that the L2 portion of the SRL 104 has stable data prior to scanning out for verification. FIG. 1 also depicts an exemplary SRL 100 that can be used to implement the present invention. The SRL 100 contains two latches, L1 102 and L2 104. When ZC 106 is pulsed, or at a high state, data from the data input port Din 108 is latched into L1 102. When ZB 110 is pulsed, or at a high state, data from L1 102 is latched into L2 104 and output through the L2 104 output port, Dout 112. The ZB 110 clock pulse is also referred to as a data launch pulse and the ZC 106 clock pulse is also referred to as a data capture pulse.

Figure 2:
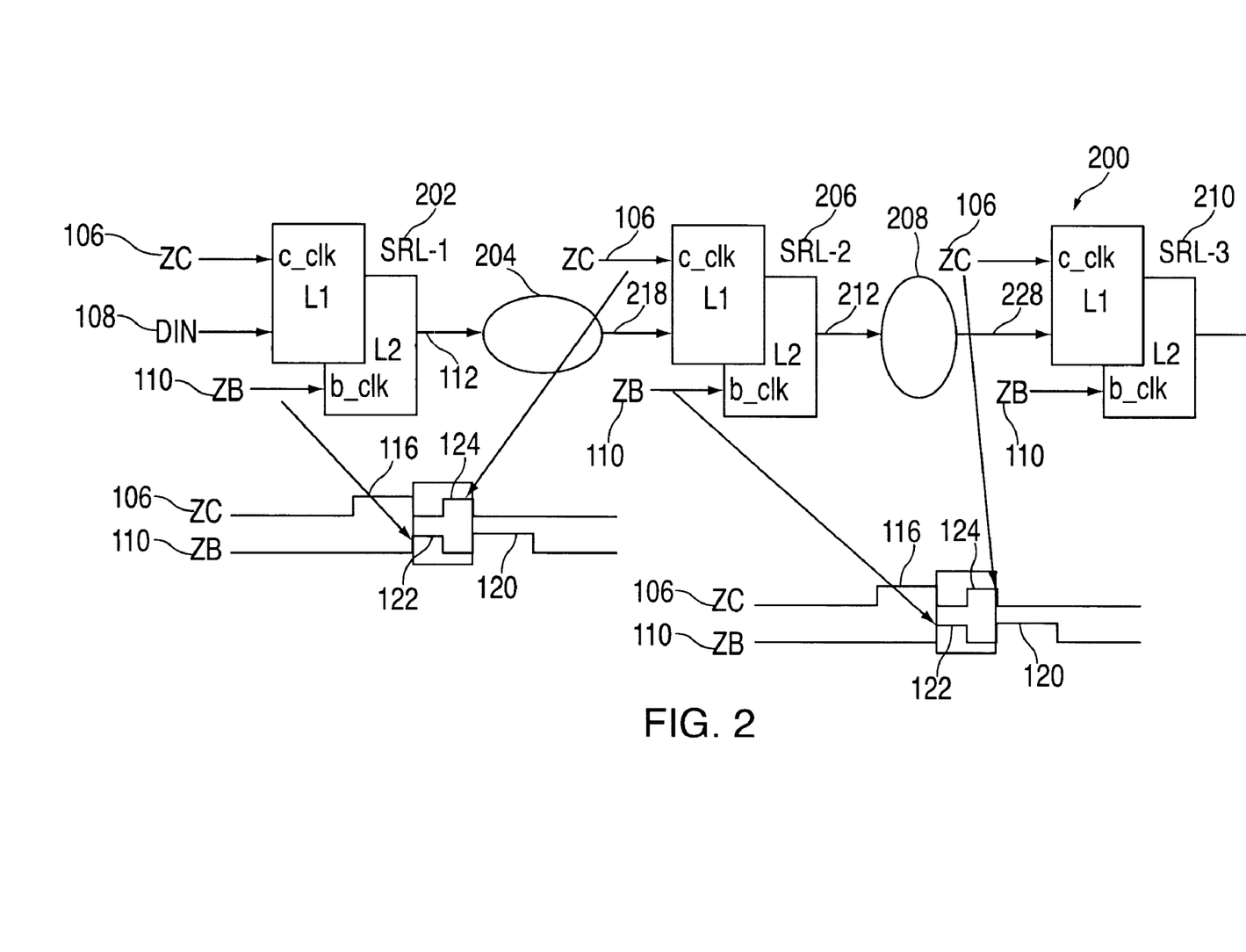
FIG. 2 depicts the relationship between a series of SRLs used during AC test and the clock pulse used to drive the AC test.

FIG. 2 depicts the relationship between a series of SRLs used during AC self-test and the clock pulses, ZC 106 and ZB 110, used to drive the AC self-test in an embodiment of the present invention. The exemplary AC self-test depicted in FIG. 2 begins at SRL-1 202. Data has already been loaded into Din 108 either through the initialization process described above or because SRL-1 202 is not the first SRL 100 in a chain of SRLs. The long ZC clock pulse 116 results in data being moved from Din 108 into the L1 of SRL-1 202 and in stabilizing the data in L1 of SRL-1 202. Then, the long ZC clock pulse 1 16 ends and the ZB at speed pulse 122 begins. This causes the data from the gate between the data input port Din 108 and L1 of SRL-1 202 to be closed. In addition, it causes the data in the L1 of SRL-1 202 to be moved into the L2 of SRL-1 202, into the Dout 112 of SRL-1 202 and into the next block of logic 204 resulting in output 218. When the at speed ZB pulse 122 ends, the at speed ZC pulse 124 begins. When this occurs the gate between the L1 and L2 of SRL-1 202 is closed and the data that is output from the logic 218 is then input into the L1 of SRL-2 206. Next, the long ZB clock pulse 120 occurs and the ZC at speed clock pulse 124 ends, causing the gate between the input 218 and the L1 of SRL-2 206 to be closed. In addition, the data in the L1 of SRL-2 206 is sent to the L2 of SRL-2 206, the output 212 of the L2 of SRL-2 206 is sent to the logic 208 and output 228 is collected to be input to the L1 of SRL-3 on the next ZC clock pulse.

During AC self-test the integrated circuit is being tested to determine if any timing errors exist on the integrated circuit. Timing errors can occur because a logic path is too long, a logic path is too short, the ZC 106 and ZB 110 pulses are not exactly synchronous, or a combination of these factors. In the case of a long logic path, data is output from the logic 218 and loaded into the L1 of SRL-2 206 before the next ZC pulse 124 ends or returns to zero. Otherwise the data being loaded into the L1 of SRL-2 206 by the next ZC pulse 124 will be incorrect. Another possible error occurs if the logic path is short and the rising edge of the ZB clock 120 runs a little early and/or the falling edge of the ZC clock 124 runs a little late. In this case, there is the risk that the logic path will be exercised twice before the ZC pulse ends. In this case, the first data launched by pulse 122, of the ZB clock 110, through the short logic path will be overwritten by the second data launched by pulse 120, of the ZB clock 110, and therefore produce incorrect results.

Figure 3:
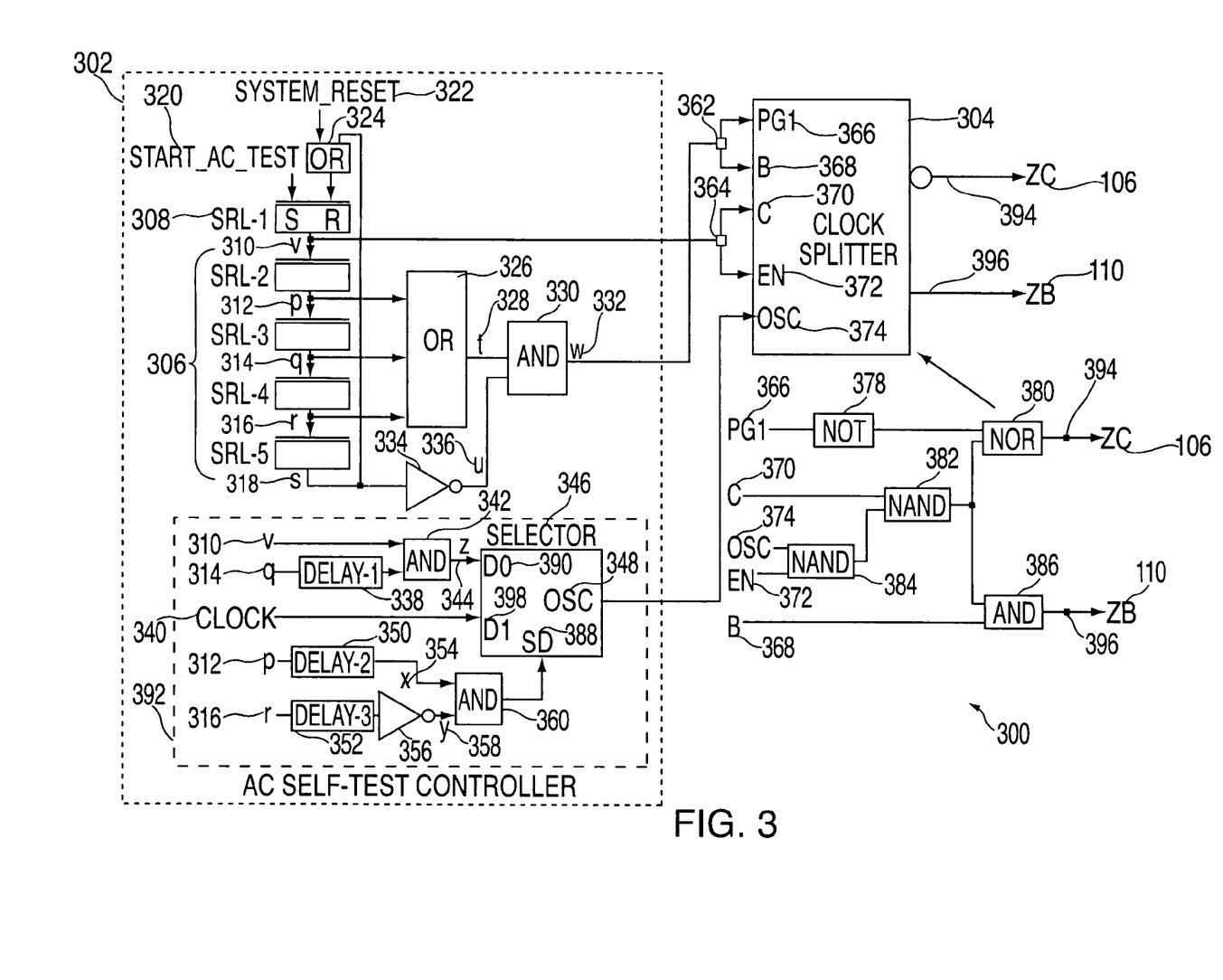
FIG. 3 is a block diagram of the components of an exemplary embodiment of the present invention including a controller and a clock splitter.

FIG. 3 is a block diagram of the components of an exemplary embodiment of the present invention that can be used to create the clock pulse 114 shown in FIG. 1. The embodiment includes self-test circuitry 300 which comprises an AC self-test controller 302 and a clock splitter 304. FIG. 3 shows the design of the controller 302 and the logic representation of the clock splitter 304. In an exemplary embodiment, one controller is shared by all on-chip clock splitters 304 and one clock splitter 304 may drive many SRLs 100. The controller 302 is designed to condition the clock splitter 304 to generate the desirable ZC 106 and ZB 110 waveforms for implementing the present invention. The ZC 106 clock pulse is received from the capture pulse output terminal 394 on the clock splitter 304. The ZB 110 clock pulse is received from the launch pulse output terminal 396 on the clock splitter 304. The controller 302 consists of one set/reset SRL 308 and four staging SRLs 306. In addition, the controller 302 includes a system reset input 322, a start_ac_test input 320 and a OR gate 324 to determine if the controller 302 should be reset. As shown in FIG. 3, the output from the set/reset SRL 308, "v" 310 is input into the C 370 and EN 372 input terminals of the clock splitter 304. The output from the first three staging SRLs, "p" 312, "q" 314, and "r" 316 are input into an OR gate 326 resulting in the output "t" 328. The output "t" 328 is then input to an AND gate 330 along with the inverted 334 value of "s" 318, the output from the last staging SRL 306. The result from the AND gate 330 is the value "w" 332 which is input to the PG1 366 and B 368 input pins on the clock splitter 304.

The portion of the controller depicted at the bottom of the diagram, the clocking generator 392 controls the input to the oscillator clock (OSC) 374 on the clock splitter 304. The output of the set/reset latch 308, "v" 310 is input to an AND gate 342. Also input to the AND gate 342 is the value of "q" 314, the output of the second staging SRL 306 after it has been sent through a half cycle delay, referred to as delay-1 338. The output from the AND gate 342, "z" 344, is input to the D0 390 of the selector 346. The input to D1 398 on the selector 346 is the system clock 340 denoted as "CLOCK". The selection of D0 390 or D1 398 in the selector 346 is controlled by the input to an AND gate 360. The output of the first staging SRL 306, "p" 312 is input into delay-2 350, which is a three-quarter cycle delay, resulting in the value "x" 354 which is one input to the AND gate 360. The output of the third staging SRL 306, "r" 316 is input into delay-3 352, which is a one-quarter cycle delay, and then inverted 356, resulting in the value "y" 358 which is the other input to the AND gate 360. The result of the AND gate 360 controls whether D0 390 or D1 398 is selected by the SD 388 in the selector 346. When SD is equal to "0", D0 390 is selected. When SD is equal to "1", D1 398 is selected. The output from the selector 346 is an OSC signal 348 which is input to the OSC 374 on the clock splitter.

The timing critical area of the controller is the three well tuned delay lines: delay-1 338, delay-2 350, and delay-3 352. The delay-1 338 is tuned to a value of approximately half a cycle time; the delay-2 350 is about three fourths of the cycle time; and the value of delay-3 352 is about one quarter of the cycle time.

The clock splitter 304 is integrated on the chip. Wiring for an exemplary clock splitter 304 that can be used by an embodiment of the present invention is shown in FIG. 3. Inputs to the clock splitter 304 are as described in reference to the controller 302. Output from the clock splitter 304 comes from the launch pulse output terminal 396 which is input to the ZB clock pulse 110. Another output from the clock splitter 304 comes from the capture pulse output terminal 394 which is input to the ZC clock pulse 106. The output from the clock splitter 304 is input to the SRLs as described in reference to FIG. 1 and FIG. 2. An example of wiring for an exemplary clock splitter 304 is shown in FIG. 3. The values of EN 372 and OSC 374 are input to a NAND gate 384. The output of the NAND gate 384 is input to another NAND gate 382 along with C 370. The result of the NAND gate 382 is input to an AND gate 386 along with B 368 resulting in the launch data output terminal which is input to the ZB clock signal 110. The output from the NAND gate 382 is also input to a NOR gate 380 along with PG1 366 after it has been put through a NOT gate 378. The result is the capture data output terminal 394 which is input to clock pulse ZC 106. ZB and ZC are complements of each other during AC test and during system mode. Note that the PG1 366 and B 368 pins of the clock splitter 304 are tied together at 362 only during AC test. A hardwired representation is shown just for clarity in the context of this invention. Similarly, note that the C 370 and EN 372 pins of the clock splitter 304 are tied together at 364 only during AC test. Again, a hardwired representation is shown just for clarity in the context of this invention.

Figure 4:
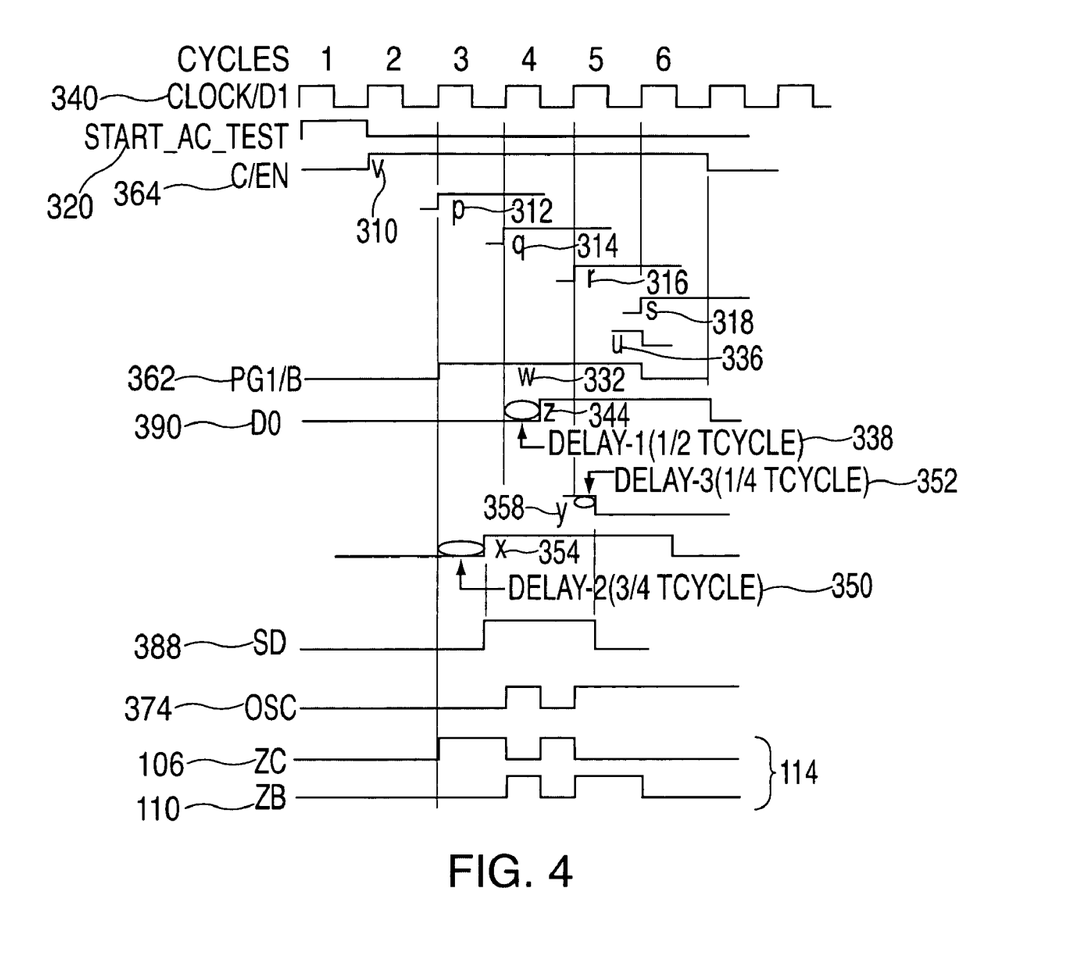
FIG. 4 is the internal timing diagram of an exemplary embodiment of the present invention.

FIG. 4 is a timing diagram associated with the exemplary embodiment of the present invention depicted in FIG. 3. FIG. 4 illustrates how the desired waveforms for ZC 106 and ZB 110 are generated. A continuously running CLOCK 340 is applied to the D1 398 pin of the selector 346 after conventional scanning has been done. A single pulse "start_ac_test" 320 is asserted. The controller 302 will then generate the proper waveforms for the PG1/B 362 and C/EN 364 pins at cycle boundaries with the C/EN 364 pulse being wider than the PG1/B 362 pulse by one cycle at both ends. The SD signal 388 of the selector is designed to be wide enough to envelope a single CLOCK 340 pulse at cycle 4. The delay elements delay-2 350 and delay-3 352 are used to provide margins at both ends of SD 388. D0 390 of the selector 346 is switched at the middle of the AC test single step operation so that there will be a long ZC 106 generated at the beginning and a long ZB 110 generated at the end of the AC test sequence. The delay element delay-1 338 is for this purpose and is less critical than delay-2 350 and delay-3 352. The entire AC operation depicted in the embodiment shown in FIG. 4 requires 6 cycles to perform.

Figure 5:
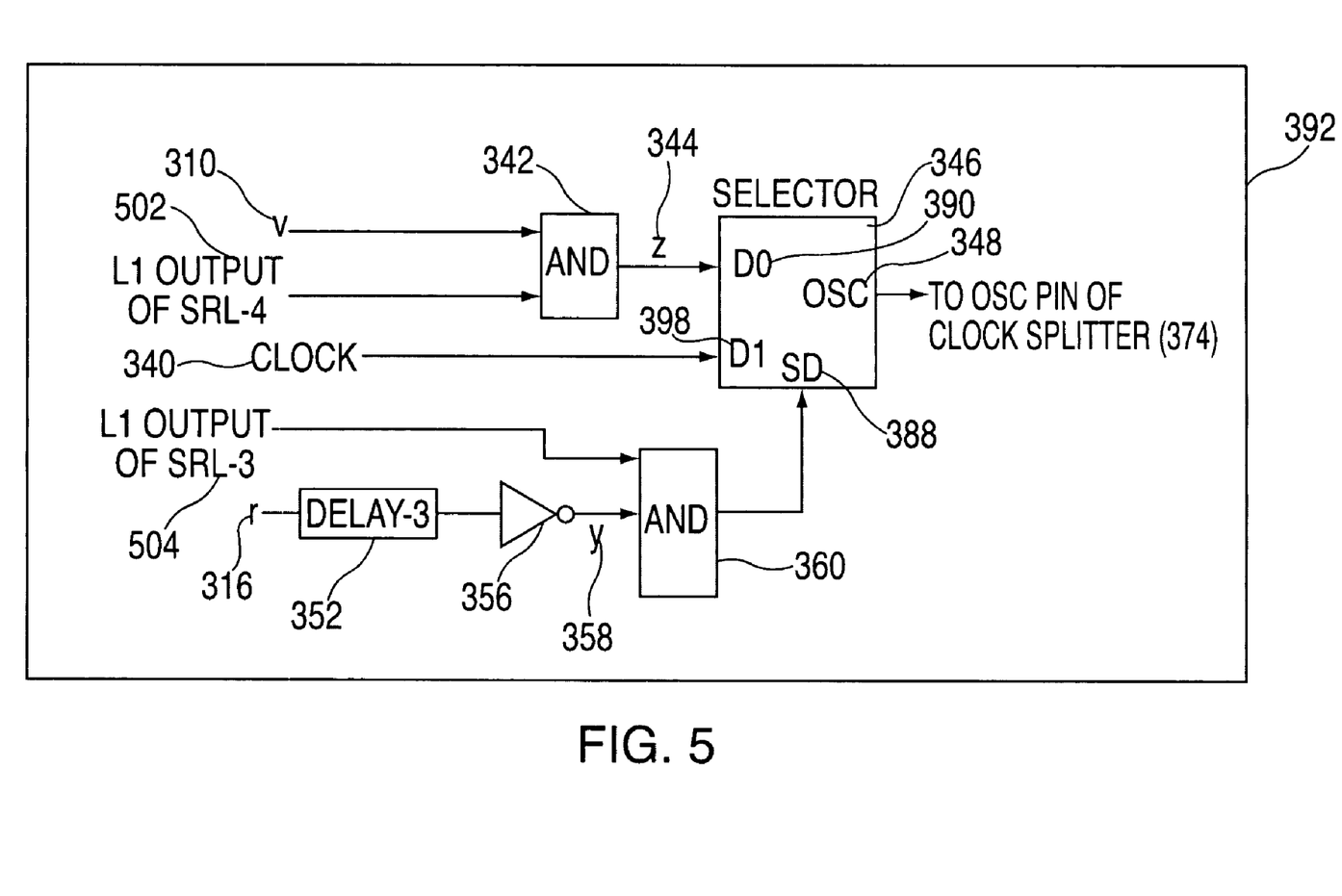
FIG. 5 is a block diagram of an alternative exemplary embodiment of a portion of the AC self-test controller with two delay elements deleted.

It is understood that there is more than one way to implement the AC self-test controller 302. FIG. 5 is another embodiment of the clocking generator portion 392 of the controller 302 that could be used to produce the waveform shown in FIG. 1. FIG. 5 shows a scheme which eliminates two delay elements, in the clocking generator section 392 of the controller 302, by taking advantage of the fact that the L1 output of the SRL 100 is offset by half a cycle with respect to its L2 output. The output from the set/reset latch 308, "v" 310 is input to an AND gate 342 along with the L1 output of SRL-4 502 which is between "q" 314 and "r" 316. SRL-4 is the third staging SRL 306 depicted in FIG. 3. The result is "z" 344 which is input to D0 390 of the selector 346. The CLOCK 340 is input to the D1 398 input pin of the selector 346, the same as in FIG. 3. SD 388 is set as a result of the output of an AND gate 360. One input to the AND gate 360 is the L1 output of SRL-3 which is between "p" 312 and "q" 314. SRL-3 is the second staging SRL 306 depicted in FIG. 3. The other input is the same as that depicted in FIG. 3, the value "r" 316 input into delay-3 352, then inverted 356, resulting in "y" 358.

The present invention utilizes the same system clock, CLOCK 340, that is utilized by the integrated circuit during normal system operation. The CLOCK 340 that is input to the controller 302 will connect to the OSC directly during normal operation. This allows the CLOCK 340 to be optimized for both normal operation and AC testing. Therefore, additional clocks for testing, which may introduce additional errors and require additional optimizing are not necessary. Another advantage to using the present invention is that the tuning of delay elements is concentrated in the controller region. Consequently, the control signals to the clock splitters remain timing non-critical. The only distribution issue is the tuning of the OSC wire (known as the "clock tree") which is a design consideration in its own right even without the AC test implemented.

As described above, the present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore, it is intended that the invention not be limited to the particular embodiments for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for performing AC self-test on an integrated circuit that includes a system clock for normal operation, the method comprising:

generating a sequence of data pulses based on the system clock, the sequence including a long data capture pulse followed by an at speed data launch pulse and an at speed data capture pulse followed by a long data launch pulse, wherein the at speed data launch pulse and the at speed data capture pulse are generated for a common cycle of the system clock; and applying the sequence of data pulses to one or more test registers, wherein the long data capture pulse followed by the at speed data launch pulse tests a data launch operation and the at speed data capture pulse followed by the long data launch pulse tests a data capture operation.

2. The method of claim 1 further comprising:
initializing said one or more test registers with test data.

3. The method of claim 2 wherein said initializing occurs using a scan technique.

4. The method of claim 1 wherein the generating is performed by a clock splitter.

5. The method of claim 1 further comprising:
receiving the long data capture pulse and the at speed data capture pulse from a capture pulse output terminal of a clock splitter; and receiving the long data launch pulse and the at speed data launch pulse from a launch pulse output terminal of the clock splitter.

6. The method of claim 5 wherein data outputs from said capture pulse output terminal and said launch pulse output terminal are complements of each other during said AC self-test.

7. The method of claim 5 wherein data outputs from said capture pulse output terminal and said launch pulse output terminal are created in response to said system clock and to an AC self-test controller.

8. The method of claim 1 wherein the one or more test registers include a first test register and a second test register, data from the first test register is input to a logic path in response to applying the at speed data launch pulse, and output data from the logic path is input to the second test register in response to applying the at speed data capture pulse.

9. The method of claim 8 further comprising:
comparing the data value in said second test register to an expected value.

10. The method of claim 9 further comprising:
detecting an error in response to said comparing.

* * * * *